United States Patent [19]
Lee

[11] Patent Number: 5,673,164
[45] Date of Patent: Sep. 30, 1997

[54] TRANSISTOR PROTECTION CIRCUIT OF A MONITOR

[75] Inventor: Moon-Geol Lee, Seoul, Rep. of Korea

[73] Assignee: Daewoo Electronics Co., Ltd., Seoul, Rep. of Korea

[21] Appl. No.: 561,597

[22] Filed: Nov. 21, 1995

[30] Foreign Application Priority Data

Nov. 23, 1994 [KR] Rep. of Korea ............... 94-30863

[51] Int. Cl.$^6$ ................................................ H02H 3/18
[52] U.S. Cl. .................................... 361/79; 361/56
[58] Field of Search ............................ 361/56, 111, 78, 361/86–87, 79, 57, 93, 101

[56] References Cited

U.S. PATENT DOCUMENTS 4,691,262 9/1987 Chalfin ................................... 361/56

Primary Examiner—Jeffrey A. Gaffin
Assistant Examiner—Michael J. Sherry
Attorney, Agent, or Firm—Lowe, Price, LeBlanc & Becker

[57] ABSTRACT

A transistor protection circuit of a monitor for protecting a transistor from a high voltage liable to instantaneously occur during a power on/off or mode conversion includes a driving transformer for generating a high voltage driving signal according to a horizontal oscillating signal, a transistor which switches according the high voltage driving signal received into a base thereof and having an emitter being grounded, a flyback transformer connected to a collector of the transistor for generating a high voltage, and a high voltage cutoff unit connected between the base and collector of the transistor. Thus, the high voltage of the flyback transformer supplied to the collector of the transistor is bypassed to the high voltage cutoff unit when an abnormal high voltage instantaneously occurs to thereby protect the transistor.

7 Claims, 2 Drawing Sheets

TRANSISTOR PROTECTION CIRCUIT OF A MONITOR

FIELD OF THE INVENTION

The present invention relates to a high voltage output circuit of a monitor, and more particularly to a transistor protection circuit of a monitor for protecting a transistor from a high voltage liable be instantaneously produced during a power on/off or a mode conversion operation.

BACKGROUND OF THE INVENTION

Generally, a monitor requires a high voltage for displaying images and the like, and the high voltage (of about 26 KV) is supplied from a flyback transformer. However, the high voltage is instantaneously generated at the moment a power of the monitor is on/off or a mode is converted (change of a frequency) to probably damage on components employed. This case will be described with reference to a conventional high voltage output circuit as shown in FIG. 1.

Referring to FIG. 1, a reference numeral 10 designates a high voltage driving transformer for generating a driving voltage in the shape of a square wave, and 20 is a transistor protecting section formed by a parallel connection of a diode D1 and a resistor R1, which is connected to an output terminal of high voltage driving transformer 10. TR1 designates a transistor having a base connected to transistor protecting section 20, an emitter being grounded and a collector connected to a flyback transformer 30. Damper diode D2 is connected to the collector of transistor TR1. C1 is a capacitor, and flyback transformer 30 is used for obtaining the high anode voltage of a braun tube in the monitor. A reference number 40 designates a chopper transformer which is connected between the collector of transistor TR1 and flyback transformer 30 for executing a compensation function to enable flyback transformer 30 to generate a stable output voltage.

When performing a normal operation in the above-described circuit, high voltage driving transformer 10 produces the driving voltage in the shape of the square wave having a magnitude capable of switching transistor TR1 in accordance with a horizontal oscillating signal. The driving voltage is applied to the base of transistor TR1 via resistor R1 of transistor protecting section 20. By this operation, transistor TR1 is switching to be on, and chopper transformer 40 is utilized to perform the compensation function at the collector of transistor TR1 for permitting flyback transformer 30 which generates the high voltage of approximately 26 KV to provide the stable high voltage during the mode conversion. Transistor protecting section 20 forces charges remaining on a high voltage output transistor to be discharged via diode D1 of transistor protecting section 20 during the power off operation.

However, in case of the power on/off or mode conversion, the driving voltage of the square wave generated from high voltage driving transformer 10 is abruptly raised at the edge portion. Consequently, an excessive high voltage is supplied to the base of transistor TR1, so that high peak current flows in the collector thereof. Such excess current is converted into heat which, in turn, shorts between the base and collector or between the collector and emitter of transistor TR1 while causing a trouble in other components.

SUMMARY OF THE INVENTION

The present invention is devised to solve the foregoing problems. It is an object of the present invention to provide a protection circuit capable of blocking a high voltage abnormally generated in case of a power on/off or a mode conversion.

It is another object of the present invention to provide a protection circuit for blocking a high voltage liable to be generated during a power on/off or a mode conversion, thereby protecting a transistor.

To achieve the above objects of the present invention, there is provided a protection circuit of a transistor of a monitor, in which a driving transformer generates a high voltage driving signal in accordance with a horizontal oscillating signal, and a transistor switches in accordance with the high voltage driving signal received into a base thereof, and an emitter thereof is grounded. In addition, a flyback transformer is connected to a collector of the transistor for generating a high voltage, and a high voltage cutoff unit is connected between the base and collector of the transistor. By this construction, the high voltage of the flyback transformer supplied to the collector of the transistor is bypassed by means of the high voltage cutoff means when a power on/off or a mode conversion occurs.

BRIEF DESCRIPTION OF THE DRAWINGS

The above objects and other advantages of the present invention will become more apparent by describing in detail preferred embodiments thereof with reference to the attached drawings in which.

DETAILED DESCRIPTION OF THE PREFERRED EMBODIMENT

Figure 1:
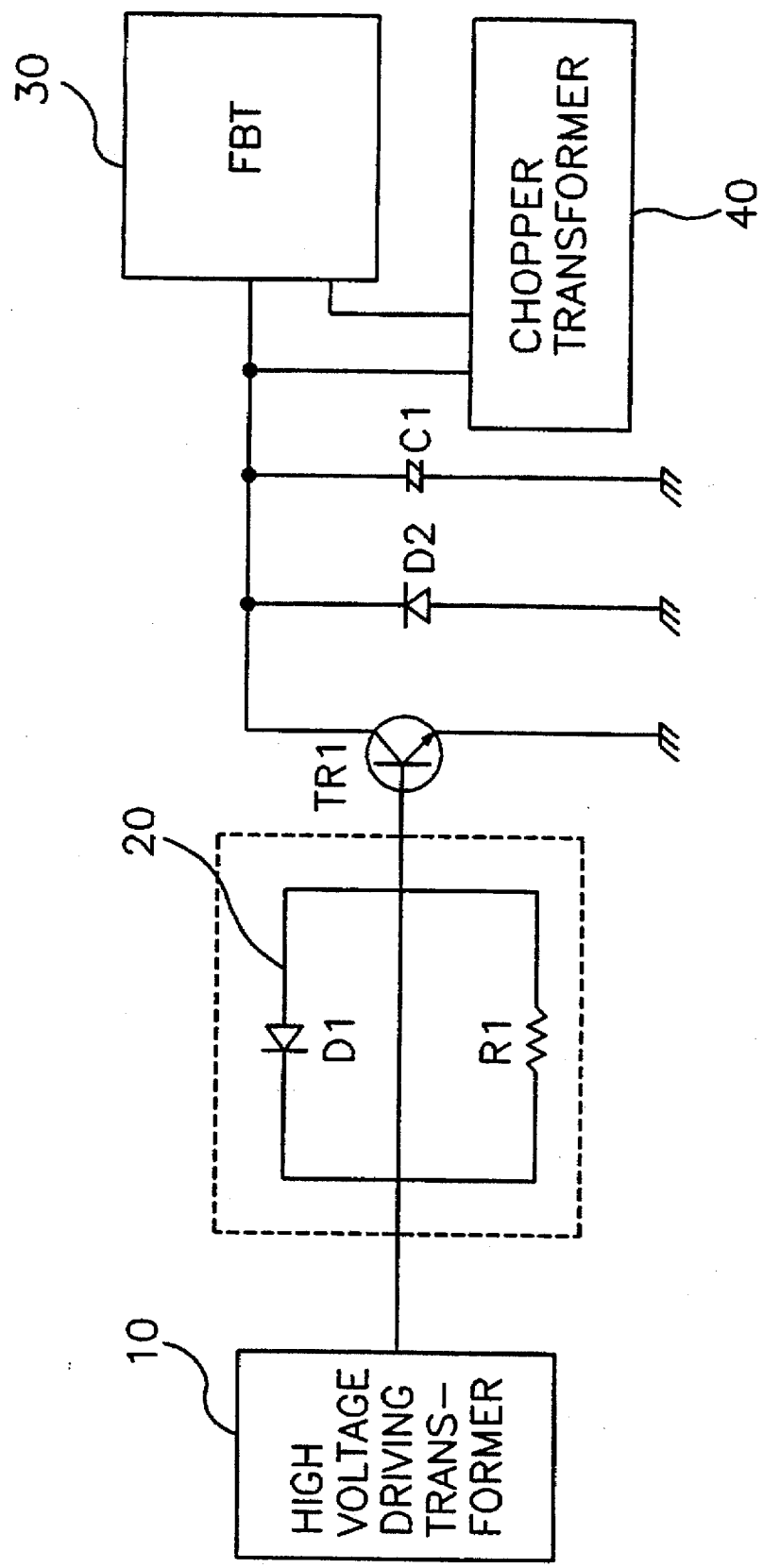
FIG. 1 is a view showing a conventional high voltage output circuit.
Figure 2:
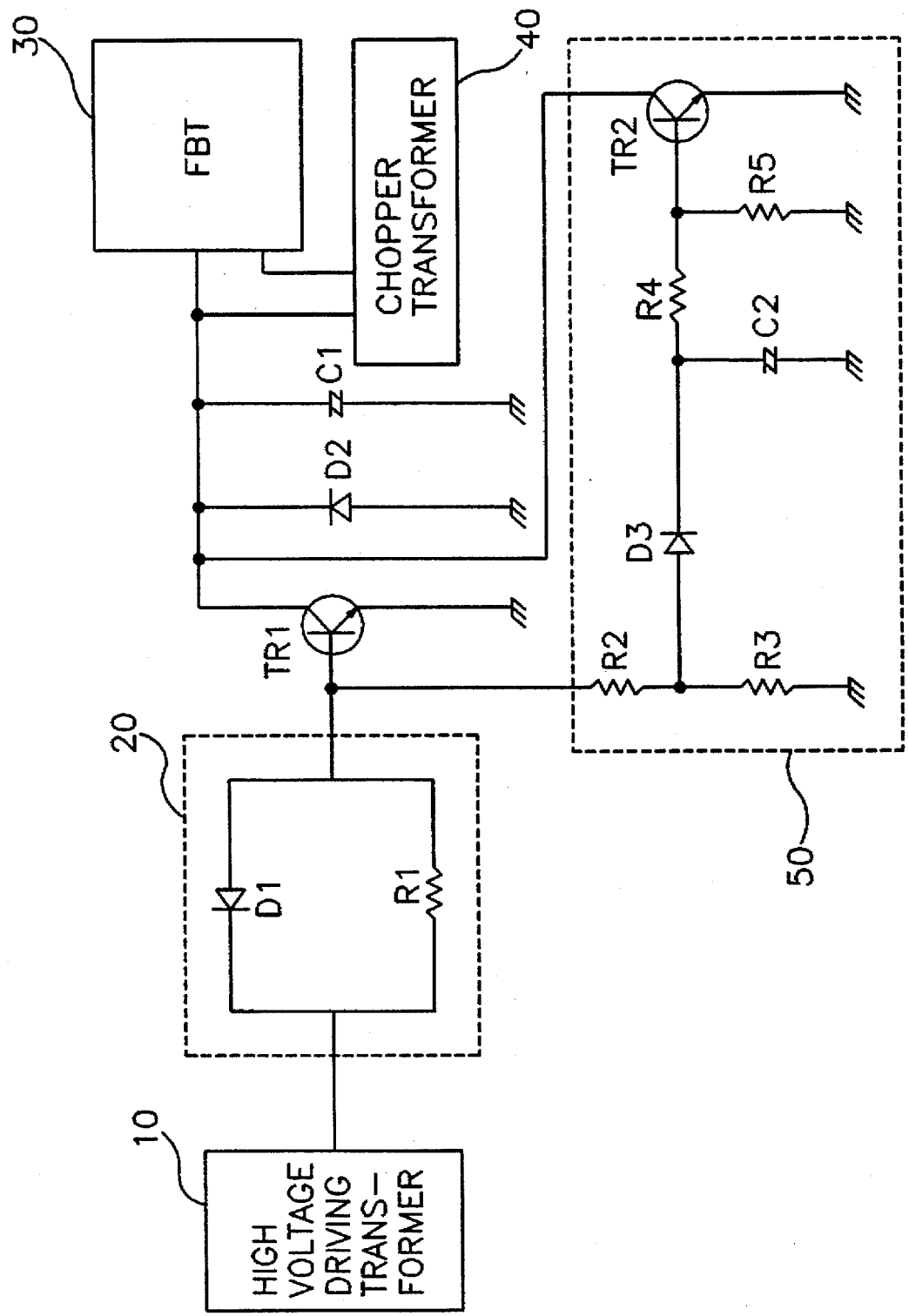
FIG. 2 is a circuit diagram showing a protection circuit of a high voltage output transistor of a monitor according to the present invention.

FIG. 2 is a schematic view showing a protection circuit of a high voltage output transistor according to the present invention. When compared with the conventional high voltage output circuit as shown in FIG. 1, the transistor protection circuit of the monitor as shown in FIG. 2 further includes a high voltage cutoff section 50 connected to both ends of the base and collector of transistor TR1. The description with respect to the same elements as those of FIG. 1 will be omitted.

As shown in FIG. 2, high voltage cutoff section 50 is connected between an output of transistor protecting section 20 and the base of transistor TR1 and between the collector of transistor TR1 and flyback transformer 30. Resistors R2 and R3 for dividing the voltage in high voltage cutoff section 50 are connected between an output terminal of transistor protecting section 20 and a ground. A connection point of resistors R2 and R3 is connected with a diode D3 which is conducted when receiving a predetermined voltage. A cathode of diode D3 is connected with a capacitor C2 for eliminating a high signal ripple. Also, a connection point of diode D3 and capacitor C2 is connected with resistor R4 for maintaining a potential value of the transistor. One end of resistor R4 is connected to a base of a transistor TR2, and a resistor R5 is connected between resistor R4 and a base of transistor TR2 for stabilizing an incoming current to the base of transistor TR2. Resistors R4 and R5 serve for setting a reference voltage value by which transistor TR2 is on/off.

In the circuit constructed as above, when performing a normal operation, i.e., when applying a normal voltage to the base of transistor TR1, the voltage divided by resistors R2 and R3 of high voltage cutoff section 50 is supplied to diode D3. Since the magnitude of the voltage supplied at this time is not enough to conduct diode D3, transistor TR2 becomes off.

Also, in accordance with the voltage supplied from high voltage driving transformer 10, transistor TR1 is conducted via the base thereof, and the collector of transistor TR1 executes the compensation for providing the stable high voltage from flyback transformer 30 by means of chopper transformer 40 connected between flyback transformer 30 and the collector of transistor TR1. Therefore, in case of the normal operation, the protection circuit as shown in FIG. 2 is operated identical to the circuit as shown in FIG. 1.

However, under the state of the power on/off or mode conversion, the driving voltage in the shape of the square wave from high voltage driving transformer 10 is abruptly raised at the edge portion to produce an instantaneous high voltage which is then supplied to high voltage cutoff section 50 via transistor protecting section 20.

The supplied voltage is divided by resistors R2 and R3 of high voltage cutoff section 50 to have a predetermined magnitude in proportional to the size of resistor R3. The divided voltage has the value greater than the voltage supplied during the normal operation to conduct diode D3.

By the conduction of diode D3, the ripple of a noise pattern is eliminated from the high voltage by means of capacitor C2, and the voltage divided by both resistor R4 connected to the connection point of diode D3 and capacitor C1 and resistor R5 connected in parallel with resistor R4 is supplied to the base of transistor TR2. At this time, resistors R4 and R5 serve for setting the reference voltage value to bias transistor TR2. By the supply of the high voltage upon the base, transistor TR2 is on. Accordingly, the high current formed to the primary turns of flyback transformer 30 is not supplied to the collector of transistor TR1, but flows toward the ground via the collector of transistor TR2 of high voltage cutoff section 50.

Therefore, when the instantaneous high voltage is supplied, the high current is not supplied to the collector of transistor TR1 but bypassed through the collector and emitter of transistor TR2 of high voltage cutoff section 50, thereby preventing the damage of transistor TR1.

As described above, when the high voltage is instantaneously received due to the power on/off or mode conversion, the high current is led to bypass, using the high voltage cutoff section. As the result, the high voltage output transistor and other components can be protected.

While the present invention has been particularly shown and described with reference to particular embodiment thereof, it will be understood by those skilled in the art that various changes in form and details may be effected therein without departing from the spirit and scope of the invention as defined by the appended claims.

What is claimed is:

1. A protection circuit of a transistor of a monitor comprising:

a driving transformer for generating a high voltage driving signal in accordance with a horizontal oscillating signal;

a transistor for switching in accordance with said high voltage driving signal received into a base thereof, an emitter thereof being grounded;

a flyback transformer connected to a collector of said transistor for generating a high voltage; and high voltage cutoff means connected between said base and collector of said transistor, whereby a high current of said flyback transformer supplied to said collector of said transistor is bypassed by means of said high voltage cutoff means when a power on/off or a mode conversion occurs.

2. The protection circuit of a transistor of a monitor as claimed in claim 1, wherein said high voltage cutoff means comprises:

means for dividing the voltage supplied to said base of said transistor;

means connected to said dividing means for selectively conducting in accordance with a magnitude of the supplied voltage;

means for switching in accordance with said voltage supplied via said conducting means to bypass said voltage from said flyback transformer; and means connected between said conducting means and said switching means for setting a reference value to determine an on/off operation of said switching means.

3. The protection circuit of a transistor of a monitor as claimed in claim 2, further comprising means for discharging charges supplied to said transistor in case of the power off operation of said driving transformer to protect said transistor, said discharging means being connected between said driving transformer and base of said transistor.

4. The protection circuit of a transistor of a monitor as claimed in claim 3, wherein said discharging means comprises a diode and a resistor parallel-connected to said diode.

5. The protection circuit of a transistor of a monitor as claimed in claim 2, wherein said conducting means is a diode.

6. The protection circuit of a transistor of a monitor as claimed in claim 2, wherein said bypass means is a transistor.

7. The protection circuit of a transistor of a monitor as claimed in claim 2, wherein said setting means comprises a first resistor connected to said conducting means to maintain a potential value to conduct said switching means; and a second resistor for stabilizing current incoming to said switching means, one end thereof being connected to a base of said switching means and other end thereof being grounded.

* * * * *